Dec. 10, 1968 J. VAN SANDWYK 3,416,101
VARIABLE ATTENUATOR
Filed May 3, 1965
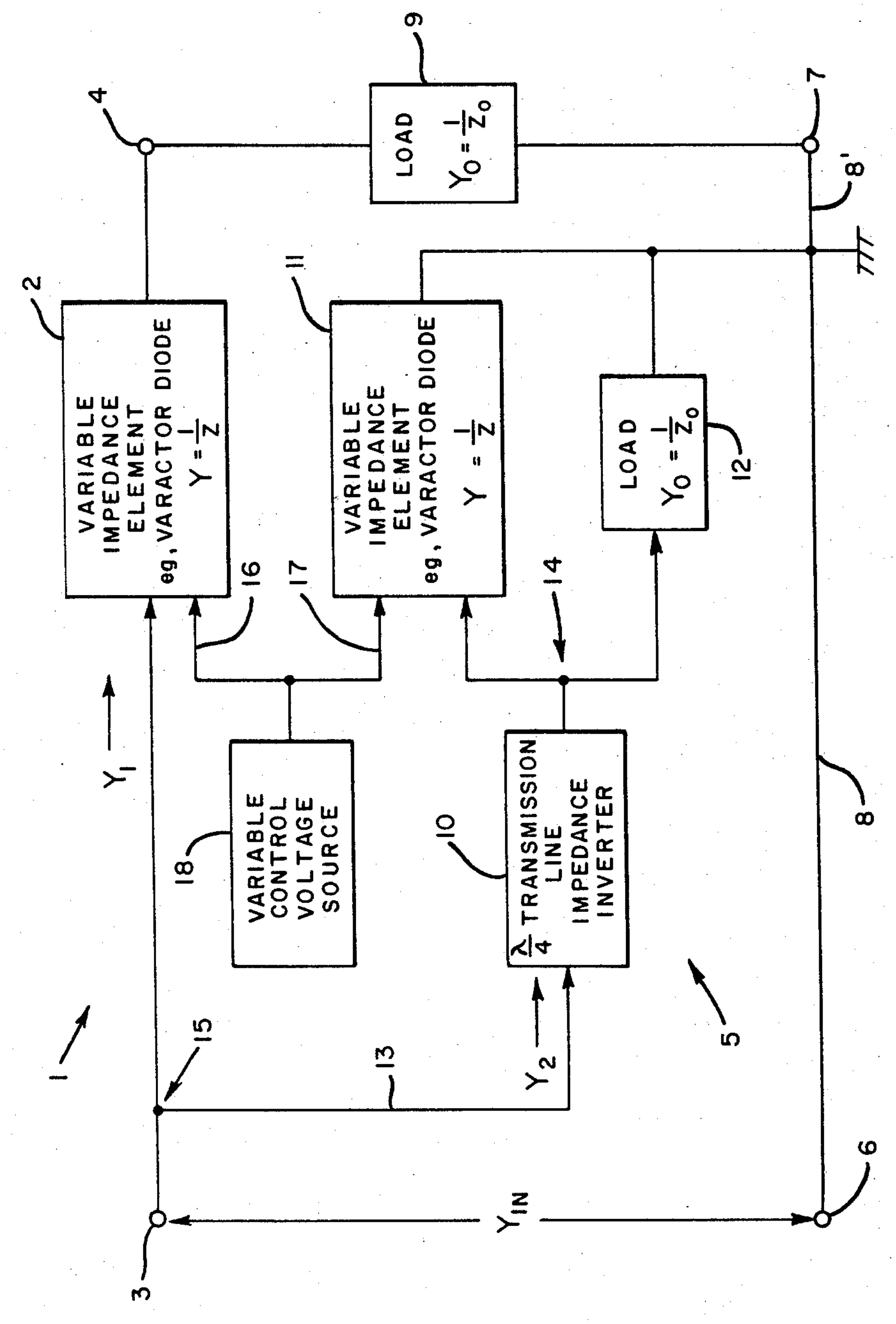
INVENTOR.
JOHANNES VAN SANDWYK
BY J. Russ L. Sawler
ATTORNEY United States Patent Office 3,416,101

Patented Dec. 10, 1968

3,416,101
VARIABLE ATTENUATOR

Johannes Van Sandwyk, Sunnyvale, Calif., assignor to Sylvania Electric Products Inc., a corporation of Delaware Filed May 3, 1965, Ser. No. 452,794
7 Claims. (Cl. 333—9)

ABSTRACT OF THE DISCLOSURE

This network has a constant input impedance $Z_0$ for attenuating an input signal having a predetermined frequency. The network includes a first variable impedance element having an impedance Z connected between input and output terminals, a load connected between the output and ground and having an impedance $Z_0$, and a by-pass circuit connected between the input terminal and ground. The by-pass circuit comprises an impedance inverter having a characteristic impedance $Z_0$ and the parallel combination of a second variable impedance element also having an impedance Z and a load having an impedance $Z_0$ connected between the inverter and ground. The impedance Z is varied to change the attenuation of the network.

This invention relates to attenuators and more particularly to an externally or remotely controlled variable attenuator having a constant input impedance.

It is desirable that receivers have means for automatically controlling signal level to prevent very strong signals from saturating any stage of the receiver. The automatic gain control (AGC) circuit, which utilizes the feedback principle to correct signal level change, is a common method for accomplishing this function. In certain applications, such as in a parametric up-converter receiver employing a crystal filter having sharp skirt selectivity and narrow passband, it may be desirable to control signal level at the output of the crystal filter. It is important in such applications that the circuit or load connected to the output of the crystal filter have a constant input impedance so that the load impedance of the crystal filter does not vary and cause a ripple to be generated in the frequency response of the filter. Conventional gain control is accomplished by altering the parameters of the amplifying device, typically a transistor, by reducing the DC bias current of the device. In many instances, this is accompanied by a change in the input impedance of the device. AGC circuits having constant input impedances presently are neither attractive nor readily available for operating at frequencies greater than 100M c.p.s. Alternatively, the signal may be controlled by attenuation of the signal. Since the magnitudes of received signals may vary rapidly, it is desirable that the attenuation be continuously variable and automatically controllable. Presently available externally controlled attenuators, such as those employing transistors and diodes, either do not have input impedances that are sufficiently constant to be useful in the above application or are not continuously variable.

An object of this invention is the provision of an automatic signal level control for signals having frequencies greater than 100M c.p.s.

Another object is the provision of a variable attenuator having a continuously variable attenuation and a constant input impedance.

Another object is the provision of a variable attenuator employing control elements having identical impedance variations.

Another object is the provision of a variable attenuator having a constant input impedance that is adaptable to remote electric control by a single control voltage.

Another object is the provision of a variable attenuator having a constant input impedance that is simple and economical to construct.

The foregoing objects are accomplished by a network comprising a first variable impedance element connected between input and output terminals. A bypass circuit comprising a second variable impedance element, connected in parallel with a load having a predetermined impedance, is connected to a reference potential and through an impedance inverter to the input terminal. The variable impedance elements are selected so that their impedance response characteristics are substantially identical. The attenuation of the network is controlled by varying the impedances of the variable impedance elements while maintaining their impedances equal. In order to pass an input signal to the output terminal with minimum attenuation, the impedances of the variable impedance elements are simultaneously adjusted to be minimum. The low impedance of the second variable impedance element is transformed to a large impedance at the input terminal by the impedance inverter to block the input signal from the bypass circuit. Maximum attenuation of the input signal is provided by simultaneously adjusting the impedances of the variable impedance elements to be maximum. The resultant impedance of the second variable impedance element and the load is transformed by the impedance inverter to an impedance at the input terminal such that the bypass circuit is matched to the input and the input signal is passed to the load. The characteristics of the impedance inverter are chosen such that when the network is terminated in the predetermined impedance, the input impedance of the network is a constant, is equal to the predetermined impedance and is independent of the impedances of the variable impedance elements.

This invention and these and other of its objects will be more fully understood from the following description of the preferred embodiment illustrated in the accompanying schematic circuit drawing.

The illustrated attenuator network comprises a series circuit or signal path 1 containing variable impedance element or varactor diode 2 between input terminal 3 and a reference potential which may be ground as shown in the drawing. A second input terminal 6 and output terminal 7 are connected through lines 8 and 8' to the reference potential. Output terminals 4 and 7 are terminated by a load 9. Load 9 has a predetermined impedance which may be equal to or proportional to the input impedance of a subsequent circuit.

The shunt circuit comprises a quarter wavelength transmission line impedance inverter 10 and the parallel combination of a variable impedance element or varactor diode 11 and load 12 which has an impedance equal to that of load 9. One terminal each of varactor diode 11 and load 12 is electrically connected to the reference potential. Each of the other terminals of diode 11 and load 12 is connected through impedance inverter 10 and line 13 to input terminal 3. Transmission line impedance inverter 10 is a quarter wavelength long at the frequency of the input signal. The impedance inverter transforms the impedance $Z_a$ of varactor diode 11 and load 12 at junction 14 to an impedance $Z_b$ at junction 15 in accordance with the relationship $$Z_a Z_b = Z_c^2 \qquad (1)$$

where $Z_c$ is the characteristic impedance of the transmission line and is chosen to be equal to the predetermined impedance of loads 9 and 12. Thus, an impedance $Z_a$ (at junction 14) which is less than the characteristic impedance $Z_c$ is transformed to an impedance $Z_b$ (at junction 15) which is greater than the characteristic impedance $Z_c$. When the impedance $Z_a$ (at junction 14) is equal to the characteristic impedance $Z_c$ (and also the predetermined impedance), the impedance $Z_b$ (at junction 15) is also equal to the predetermined impedance.

The impedances of varactor diodes 2 and 11 are varied by control voltages on lines 16 and 17, respectively, from variable control voltage source 18. The varactor diodes are selected to have substantially identical response characteristics (impedance versus bias voltage characteristics, for a given frequency). The impedance of varactor diode 2 is maintained equal to the impedance of varactor diode 11 as the control voltages and impedances of the diodes are varied.

In operation, an input signal is applied between input terminals 3 and 6. When it is desired to pass the input signal with minimum attenuation, the control voltages on lines 16 and 17 are adjusted to bias the varactor diodes to have a minimum or zero impedance. The impedance of diode 2 in the series circuit is therefore very small under such bias conditions. Similarly, the combined impedance of varactor diode 11 and load 12 has a low impedance. This low impedance at junction 14 is inverted by impedance inverter 10 and reflected back to junction 15 as a large impedance. It appears to an input signal therefore that line 13 is an open circuit between input terminals 3 and 6 so the signal is effectively blocked from the shunt circuit and is passed to output terminal 4 without attenuation.

When it is desired to provide maximum attenuation of the input signal, the control voltages on lines 16 and 17 are adjusted to bias the varactor diodes to have maximum impedances much greater than the predetermined impedance. The impedance of diode 2 in the signal path is therefore very large under such bias conditions whereas the parallel combination of diode 11 and load 12 results in an impedance at junction 14 which is approximately equal to the impedance of load 12 (the predetermined impedance). This impedance at junction 14 is reflected back to junction 15 as an impedance approximately equal to the predetermined impedance, but much less than the impedance of varactor diode 2. The input signal is therefore passed through the bypass circuit and is dissipated in load 12 to provide maximum attenuation of the input signal.

Attenuation of the input signal between these minimum and maximum values (varying the portion of the input signal bypassed to load 12) is controlled by simultaneously varying the impedance of the varactor diodes between their maximum and minimum values while maintaining their impedances equal. As noted above, varactor diodes 2 and 11 are selected so that their impedance response characteristics are substantially identical.

The constant value of the input impedance of the network (between input terminals 3 and 6) over changes in the impedances of varactor diodes 2 and 11 and the attenuation of the network is verified by following the analysis of the input admittance (the reciprocal of the input impedance) of the network. The input admittance $Y_{in}$ between input terminals 3 and 6 is $$Y_{in}=Y_1+Y_2 \tag{2}$$

where $Y_1$ is the admittance of the series circuit including varactor diode 2 and load 9, and $Y_2$ is the admittance of the shunt circuit.

The admittance $Y_1$ is $$Y_1=\frac{YY_0}{Y+Y_0} \tag{3}$$

where Y is the admittance of varactor diode 2 and $$Y_0=1/Z_0$$

and $Z_0$ is the predetermined impedance and is equal to the impedance of load 9. The admittance $Y_2$ of bypass circuit 5 is $$Y_2=Y_0\left[\frac{(Y+Y_0)\cos\beta l+jY_0\sin\beta l}{Y_0\cos\beta l+j(Y+Y_0)\sin\beta l}\right]$$

$$=\frac{Y_0^2}{Y+Y_0} \tag{4}$$

where $Y_0=1/Z_0$, $Z_0$ is the predetermined impedance and is equal to the impedance of load 12, Y is the admittance of varactor diode 11, $\beta=2\pi/\lambda$, $\lambda$ is wavelength and $l=\lambda/4$. Substituting Equations (3) and (4) in Equation (2), the input admittance $Y_{in}$ of the network is $$Y_{in}=\frac{YY_0}{Y+Y_0}+\frac{Y_0^2}{Y+Y_0}$$

$$=Y_0 \tag{5}$$

and therefore $$Z_{in}=Z_0 \tag{6}$$

where $Z_{in}$ is the input impedance of the network. Thus, it is seen that the input impedance of the network is a constant equal to the predetermined impedance and is independent of the impedance of the varactor diodes.

Although this invention has been shown and described in relation to a preferred embodiment thereof, variations and modifications will be apparent to those skilled in the art. For example, variable impedance elements having impedances that are resistive or complex (i.e., having both a real and an imaginary component) may be employed in place of varactor diodes 2 and 11. The scope and breadth of this invention is therefore to be determined from the following claims rather than from the above detailed description.

What is claimed is:

1. A variable attenuator having a substantially constant input impedance equal to a predetermined impedance for attenuating an input signal having a predetermined frequency, said attenuator comprising a first varactor diode having first and second terminals, a transmission line having a length equal to a quarter wavelength at the predetermined frequency, having a characteristic impedance equal to said predetermined impedance and having one end connected to the first terminal of said first varactor diode, a second varactor diode having a first terminal connected to the other end of said transmission line and having a second terminal connected to a reference potential, said varactor diodes having substantially identical impedance characteristics, a first load connected in parallel with said second varactor diode, the impedance of said first load being equal to the predetermined impedance, a second load connected between the second terminal of said first varactor diode and the reference potential for terminating the attenuator in the predetermined impedance, means for applying the input signal to the first terminal of said first varactor diode, a control source for generating a variable control voltage, and means for simultaneously applying the control voltage to said first and second varactor diodes for simultaneously providing equal variation in the impedances of said varactor diodes while maintaining the impedances substantially equal for varying the portion of the input signal passed by said second varactor diode.

2. A variable attenuator having a substantially constant input impedance equal to a predetermined impedance for attenuating an input signal having a predetermined frequency, said attenuator comprising a control source for generating a variable control signal, first and second variable impedance elements each having first and second terminals and having substantially identical impedance characteristics, each of said variable impedance elements being responsive to the control signal for simultaneously providing equal variation of the impedances of said elements while maintaining the impedances equal, an impedance inverter having an input connected to the first terminal of said first element, having an output connected to the first terminal of said second element and having a characteristic impedance equal to the predetermined impedance at the predetermined frequency, a first load connected in parallel with said second variable impedance element and having an impedance equal to the predetermined impedance, means for connecting the second terminal of said second element to a reference potential, means for applying the input signal to the first terminal of said first element, and a second load connected between the second terminal of said first element and the reference potential for terminating the attenuator in the predetermined impedance.

3. A variable attenuator for attenuating an input signal having a predetermined frequency comprising a first variable impedance element having an input and an output, a bypass circuit connected between the input to said first variable impedance element and a reference potential comprising an impedance inverter having an input connected to the input of said first element and having an output, a second variable impedance element having an input connected to the output of said impedance inverter and having an output connected to the reference potential, and a load having a predetermined impedance connected in parallel with said second element, said impedance inverter having a characteristic impedance equal to the predetermined impedance at the frequency of the input signal, means connected between the output of said first element and the reference potential for terminating the attenuator in said predetermined impedance, means for applying the input signal to the input of said first element, and means for varying the impedances of said variable impedance elements while maintaining the impedances equal for varying the attenuation of the input signal.

4. A first variable attenuator comprising a variable impedance element having an input and an output and having an admittance Y, a first load connected between the output of said first variable impedance element and a reference potential for terminating the attenuator in a predetermined impedance, said first load having a predetermined admittance $Y_0$, a bypass circuit connected between the input to said first variable impedance element and the reference potential, said bypass circuit having an input admittance satisfying the relationship $$\frac{Y_0^2}{Y_0+Y}$$

and means for varying the admittance Y for varying the portion of the input signal passed by said bypass circuit.

5. The attenuator according to claim 4 wherein said bypass circuit comprises a second variable impedance element having an admittance Y.

6. The attenuator according to claim 5 wherein said by-pass circuit includes a second load connected in parallel with said second element and having a predetermined admittance $Y_0$.

7. The attenuator according to claim 6 wherein said bypass circuit includes an impedance inverter connected in series between the input to said first element and the parallel combination of said second element and said second load, said inverter having a characteristic admittance $Y_0$.

References Cited

UNITED STATES PATENTS

| | | | |
|---|---|---|---|
| 2,138,996 | 12/1938 | Blumlein | 333—76 |
| 2,396,708 | 3/1946 | Leeds | 333—22 X |
| 3,049,667 | 8/1962 | Broadhead et al. | 324—81 X |
| 3,110,004 | 11/1963 | Pope | 334—15 |
| 3,188,566 | 6/1965 | Bullene | 333—6 X |
| 3,217,275 | 11/1965 | Duncan et al. | 333—6 X |
| 2,258,974 | 10/1941 | Dagnall | 333—8 X |
| 2,270,416 | 1/1942 | Cork et al. | 333—8 X |
| 2,762,017 | 9/1956 | Bradburd et al. | 333—9 |
| 2,861,245 | 11/1958 | Krause | 333—9 |

FOREIGN PATENTS

| | | |
|---|---|---|
| 817,962 | 8/1959 | Great Britain. |

HERMAN KARL SAALBACH, *Primary Examiner.*

W. PUNTER, *Assistant Examiner.*

U.S. Cl. X.R.

333—35, 70, 81; 334—15; 333—7